(12) United States Patent
Kuo et al.

(10) Patent No.: US 9,584,141 B2
(45) Date of Patent: Feb. 28, 2017

(54) ALL DIGITAL PHASE-LOCKED LOOP

(71) Applicant: TAIWAN SEMICONDUCTOR MANUFACTURING CO., LTD., Hsinchu (TW)

(72) Inventors: Feng-Wei Kuo, Hsinchu County (TW); Chewn-Pu Jou, Hsinchu (TW); Huan-Neng Chen, Taichung (TW); Kuang-Kai Yen, Kaohsiung (TW); Lan-Chou Cho, Hsinchu (TW); Robert Bogdan Staszewski, Delft (NL); Tsung-Hsiung Lee, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/990,583

(22) Filed: Jan. 7, 2016

(65) Prior Publication Data

US 2016/0294400 A1    Oct. 6, 2016

Related U.S. Application Data

(60) Provisional application No. 62/141,234, filed on Mar. 31, 2015.

(51) Int. Cl.
*H03L 7/085*    (2006.01)
*H03L 7/099*    (2006.01)
*H03L 7/18*     (2006.01)
*H03L 7/00*     (2006.01)

(52) U.S. Cl.
CPC ............ *H03L 7/0991* (2013.01); *H03L 7/00* (2013.01); *H03L 7/085* (2013.01); *H03L 7/18* (2013.01)

(58) Field of Classification Search
CPC ............ H03L 7/18; H03L 7/00; H03L 7/0991; H03L 7/085
USPC ..... 327/156, 158, 159; 375/376; 331/16, 34, 331/1 A
See application file for complete search history.

(56) References Cited

U.S. PATENT DOCUMENTS 8,638,172 B2 *  1/2014  Suzuki .............. H03L 7/18
                                                 327/154

* cited by examiner

*Primary Examiner* — Arnold Kinkead
(74) *Attorney, Agent, or Firm* — Maschoff Brennan

(57) ABSTRACT

A circuit and a method are disclosed herein. The circuit includes a digitally controlled oscillator and a detector. The digitally controlled oscillator is configured to generate an oscillator signal according to an oscillator tuning word. The detector is configured to output one of a first control word and a second control word that is derived from the first control word as the oscillator tuning word.

20 Claims, 6 Drawing Sheets

110

ALL DIGITAL PHASE-LOCKED LOOP

PRIORITY CLAIM AND CROSS-REFERENCE

This application claims priority to U.S. Provisional Application Ser. No. 62/141,234, filed Mar. 31, 2015, which is herein incorporated by reference.

BACKGROUND

An all-digital phase locked loop (ADPLL) locks a phase of an oscillator signal which is outputted from the ADPLL, to a phase of a reference signal. In some approaches, the ADPLL utilizes a closed-loop feedback mechanism, which feeds the oscillator signal back to a phase detector. The phase detector then detects a phase difference between the oscillator signal and the reference signal, such that the phase of the oscillator signal is adjusted by a local oscillator in response to the detected phase difference.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
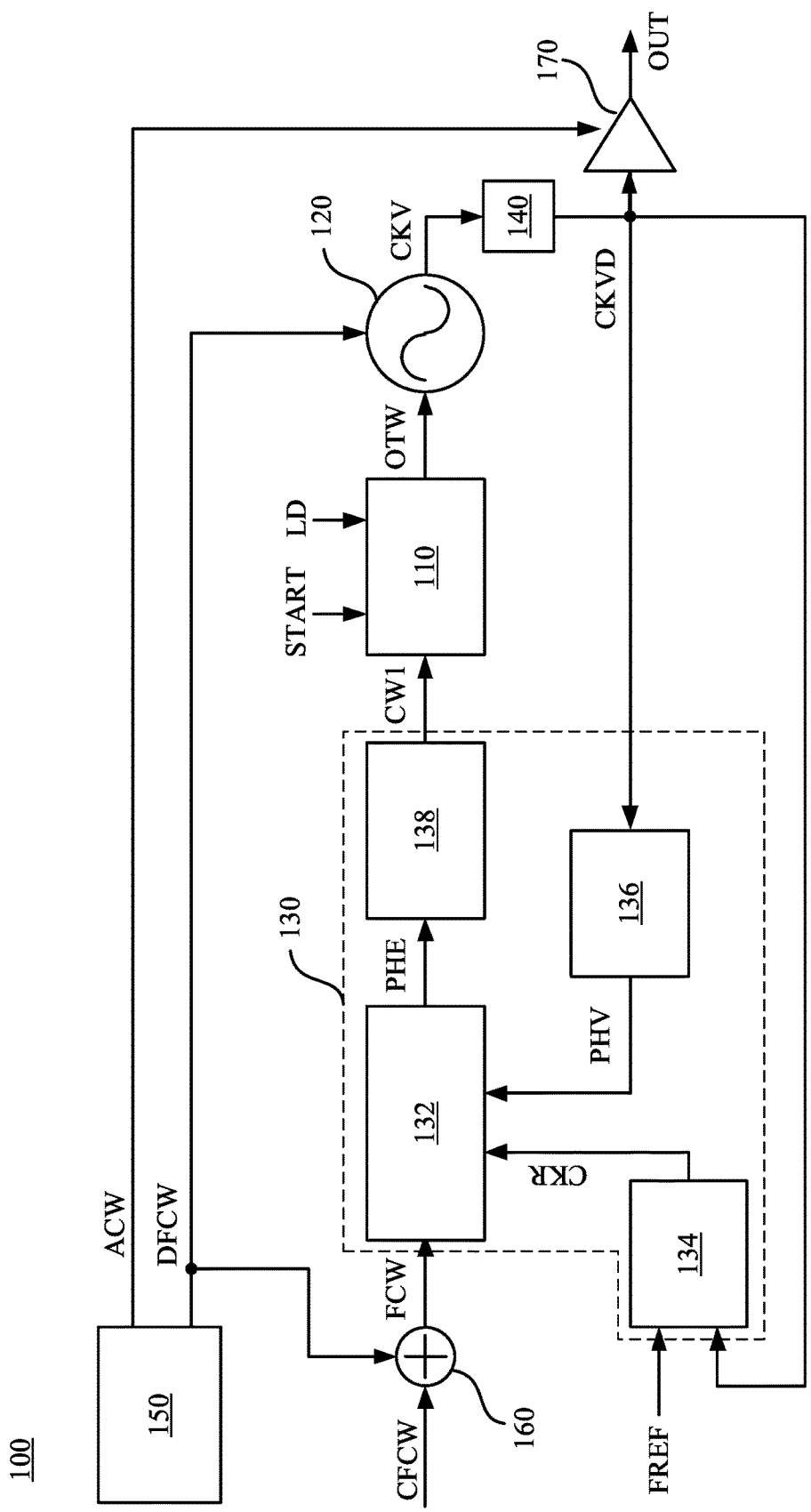
FIG. 1 is a schematic diagram of a circuit in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

FIG. 1 is a schematic diagram of a circuit 100 in accordance with various embodiments of the present disclosure. In some embodiments, the circuit 100 is implemented in or implemented as an all digitally phase-locked loop (ADPLL) circuit.

As illustratively shown in FIG. 1, the circuit 100 includes a detector 110, a digitally controlled oscillator 120, a control word generator 130, a divider 140, a modulator 150, an adder 160, and an amplifier 170.

In some embodiments, the modulator 150 is configured to output a data frequency control word DFCW for the control of the control word generator 130 to adjust the frequency of an output signal OUT, and an amplitude control word ACW for the control of the amplifier 170 to adjust the amplitude of the output signal OUT. In some embodiments, the modulator 150 is implemented by a GFSK modulator.

The adder 160 is configured to receive the channel frequency control word CFCW, and to superimpose the CFCW on the DFCW to generate a frequency control word FCW. In some embodiments, the frequency control word FCW represents a ratio of a desired RF carrier frequency divided by a frequency of a frequency reference signal FREF. For illustration, an input terminal of the adder 160 is configured to receive the channel frequency control word CFCW. Another input terminal of the adder 160 is electrically coupled to the modulator 150 to receive the data frequency control word DFCW. An output terminal of the adder 160 is configured to output the frequency control word FCW.

The control word generator 130 includes a phase detector 132, a time-to-digital converter (TDC) 134, a counter 136 and a filter 138. The phase detector 132 is configured to detect the frequency and the phase error of the circuit 100 and generate a phase error signal PHE indicating the phase error accordingly. In some embodiments, the phase detector 132 detects the phase and the frequency according to the frequency control word FCW, a retimed reference clock CKR, and a variable phase signal PHV. A first input terminal of the phase detector 132 is electrically coupled to the output terminal of the adder 160 to receive the frequency control word FCW, a second input terminal of the phase detector 132 is configured to receive the retimed reference clock CKR, a third input terminal of the phase detector 132 is configured to receive the variable phase signal PHV, and an output terminal of the phase detector 132 is configured to output the phase error signal PHE.

The retimed reference clock CKR sent to the phase detector 132 is generated by the time-to-digital converter 134. The time-to-digital converter 134 is configured to generate the retimed reference clock CKR according to the frequency reference signal FREF and a down-divided oscillator signal CKVD. The retimed digital reference clock CKR is generated by synchronizing the frequency reference signal FREF clock domain and the down-divided oscillator signal CKVD clock domain. In some embodiments, the down-divided oscillator signal CKVD is configured to be a feedback signal for the control word generator 130, as illustratively shown in FIG. 1. A first input terminal of the time-to-digital converter 134 is configured to receive the frequency reference signal FREF, a second input terminal of the time-to-digital converter 134 is configured to receive the down-divided oscillator signal CKVD, and an output terminal of the time-to-digital converter 134 is electrically coupled to the second input terminal of the phase detector 132 and configured to output the retimed reference clock CKR to the phase detector 132.

The counter 136 is configured to generate the variable phase signal PHV according to the down-divided oscillator signal CKVD. In some embodiments, the counter 136 counts at each rising edge of the down-divided oscillator signal CKVD to generate the variable phase signal PHV. Alternatively, in some other embodiments, the counter 136 counts at each falling edge of the down-divided oscillator signal CKVD to generate the variable phase signal PHV. An input terminal of the counter 136 is configured to receive the down-divided oscillator signal CKVD, and an output terminal of the counter 136 is electrically coupled to the third input terminal of the phase detector 132 and configured to output the variable phase signal PHV to the phase detector 132.

The configurations of the counter 136 are given for illustrative purposes. Various configurations of the counter 136 are within the contemplated scoped of the present disclosure.

The filter 138 is configured to filter the phase error signal PHE to generate a control word CW1. In some embodiments, the filter 138 is a digital loop filter, and configured to generate the control word CW1 based upon the phase error. In some embodiments, the filter 138 is configured to selectively perform type-I and type-II frequency settling. For example, in some embodiments, the filter 138 is configured to operate in a type-I ADPLL frequency settling mode to enable quick frequency settling. In the type-I ADPLL frequency settling mode, the phase error signal PHE is provided to one or more FIR filters within the filter 138. Once the frequency has been settled, the filter 138 is configured to switch to a type-II ADPLL phase settling to enable higher order signal and noise filtering. In the type-II ADPLL frequency settling mode, the phase error signal PHE is provided to one or more IIR filters. An input terminal of the filter 138 is electrically coupled to the output terminal of the phase detector 132 to receive the phase error signal PHE, and an output terminal of the filter 138 is configured to output the control word CW1.

Figure 2:
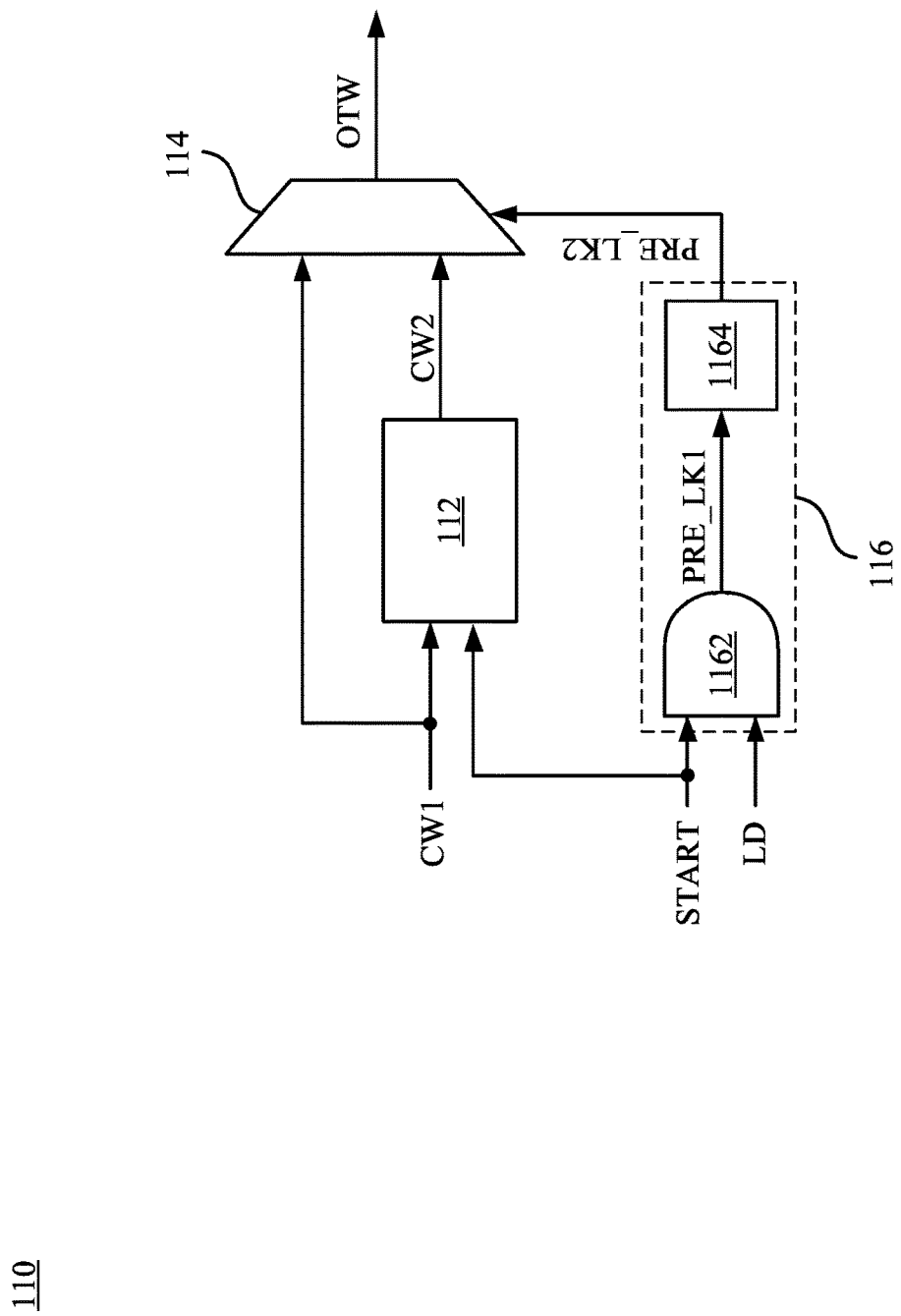
FIG. 2 is a schematic diagram of a detector in FIG. 1 in accordance with various embodiments of the present disclosure.

In some embodiments, the detector 110 is configured to output one of a control word CW1 and a control word CW2 as the output OTW, as shown in FIG. 2 and described below, in which the control word CW2 is derived from the control word CW1, as will be illustrated below in FIG. 2. In some embodiments, the detector 110 detects whether the circuit 100 operates in a closed-loop control mode or an open-loop control mode based on a start signal START and a lock signal LD. When the circuit 100 operates in the closed-loop control mode, the detector 110 outputs the control word CW1 as the oscillator tuning word OTW. When the circuit 100 operates in the open-loop control mode, the detector 110 outputs the control word CW2 as the oscillator tuning word OTW, as will be illustrated below in FIG. 2. A first input terminal of the detector 110 is electrically coupled to the output terminal of the filter 138 to receive the control word CW1, a second input terminal of the detector 110 is configured to receive the start signal START, a third input terminal of the detector 110 is configured to receive the lock signal LD, and an output terminal of the detector 110 is configured to output the oscillator tuning word OTW.

In some embodiments, the digitally controlled oscillator 120 is configured to generate an oscillator signal CKV according to the oscillator tuning word OTW and the data frequency control word DFCW. In some embodiments, the oscillator tuning word OTW provides corresponding operating voltage to control the frequency of the oscillator signal CKV. Thus, the digitally controlled oscillator 120 is configured to vary a frequency of the oscillator signal CKV based upon the oscillator tuning word OTW. Over a plurality of clock cycles, the oscillator tuning word OTW drives the circuit 100 to enter a locked state by minimizing the phase error signal PHE. A first input terminal of the digitally controlled oscillator 120 is electrically coupled to the output terminal of the detector 110 to receive the oscillator tuning word OTW, a second input terminal of the digitally controlled oscillator 120 is electrically coupled to the modulator 150 to receive the data frequency control word DFCW, and an output terminal of the digitally controlled oscillator 120 is configured to output the oscillator signal CKV.

In some embodiments, the divider 140 is configured to divide the frequency of the oscillator signal CKV to output the down-divided oscillator signal CKVD. In some embodiments, the divider 140 divides the frequency of the oscillator signal CKV by two to output the down-divided oscillator signal CKVD. For example, in some embodiments, the frequency of the down-divided oscillator signal CKVD is in the range of approximately 2.4-2.483 GHz, but the present disclosure is not limited thereto. An input terminal of the divider 140 is electrically coupled to the output terminal of the digitally controlled oscillator 120 to receive the oscillator signal CKV. An output terminal of the divider 140 is electrically coupled to the second input terminal of the time-to-digital converter 134 and the input terminal of the counter 136, to output the down-divided oscillator signal CKVD to the counter 136. The amplifier 170 is configured to generate the output signal OUT according to the down-divided oscillator signal CKVD and the amplitude control word ACW. A first input terminal of the amplifier 170 is electrically coupled to the output terminal of the divider 140 to receive the down-divided oscillator signal CKVD, a second input terminal of the amplifier 170 is electrically coupled to the modulator 150 to receive the amplitude control word ACW, and an output terminal of the amplifier 170 is configured to output the output signal OUT. In some embodiments, the amplifier 170 is a digital power amplifier (DPA).

When the circuit 100 operates in the closed-loop mode, the detector 110 outputs the oscillator tuning word OTW being the same as the control word CW1 to the digitally controlled oscillator 120, in order to tune the oscillator signal CKV. The frequency of the oscillator signal CKV is then divided by the divider 140 to output the down-divided oscillator signal CKVD to the time-to-digital converter 134 and the counter 136. As discussed above, the phase error signal PHE indicates the error between the frequency of the oscillator signal CKV and the desired value of the frequency control word FCW. With the feedback control loop of the control word generator 130, the phase error signal PHE decreases accordingly. Thus, the control word CW1 filtered from the phase error signal PHE is adjusted accordingly to calibrate the frequency of the oscillator signal CKV.

Moreover, when the frequency of the oscillator signal CKV is locked, the detector 110 receives the lock signal LD to calibrate the amplitude of the oscillator signal CKV. Over a plurality of clock cycles, the amplitude calibration of the oscillator signal CKV is completed, and the start signal START is outputted to the detector 110 with a predetermined time delay to the lock signal LD. In some embodiments, it takes approximately 10 nanoseconds to complete the amplitude calibration. The detector 110 receives the start signal START, and stores the current data of the control word CW1 as the control word CW2 in the detector 110.

In some embodiments, when the detector 110 receives the start signal START having a predetermined level, the circuit 100 enters the open-loop control mode. In the open-loop control mode, the detector 110 outputs the control word CW2, as illustrated in FIG. 2 and described below, stored in the detector 110 as the oscillator tuning word OTW, in order to tune the oscillator signal CKV. In some embodiments, digital circuits of the control word generator 130 are configured to be turned off during the open-loop control mode, since the oscillator tuning word OTW is kept being as the control word CW2. For illustration, the phase detector 132, the time-to-digital converter 134, the counter 136 and the filter 138 are configured to be turned off during the open-loop control mode. Thus, the power consumption of the feedback control loop of the control word generator 130 is saved during the open-loop mode. Accordingly, the dynamic power consumption of the circuit 100 is reduced.

The arrangement of the circuit 100 in FIG. 1 is given for illustrative purposes. Various arrangements of the circuit 100 are within the contemplated scope of the present disclosure. For example, in some embodiments, the detector 110 and the digitally controlled oscillator 120 are implemented in other structures for the phase-locked loops (PLLs), all-digital phase-locked loops (ADPLLs) or frequency synthesizers. In some embodiments, the circuit 100 is implemented or applied in ADPLLs in Bluetooth® low energy (BLE) applications. In some embodiments, the circuit 100 is implemented in extra low power applications, including, for example, wearable applications and Internet of Things (IoT) applications.

Reference is made to FIG. 2. FIG. 2 is a schematic diagram of the detector 110 in FIG. 1, in accordance with various embodiments of the present disclosure. As described above, the detector 110 saves the data of the control word CW1 as the control word CW2 when the detector 110 receives the start signal START having a predetermined level. For illustration in FIG. 2, the detector 110 includes a memory 112, a selector 114, and a control unit 116.

In some embodiments, the memory 112 is configured to latch the control word CW1 as the control word CW2 according to the start signal START. An input terminal of the memory 112 is configured to receive the control word CW1, a control terminal of the memory 112 is configured to receive the start signal START, and an output terminal of the memory 112 is configured to output the control word CW2.

In some other embodiments, the memory 112 is configured to store the control word CW1 as the control word CW2 and keep the data of the control word CW2 fixed when the memory 112 receives the start signal START.

The selector 114 is configured to output one of the control word CW1 and the control word CW2 as the oscillator tuning word OTW according to a state signal PRE_LK2. For illustration, in some embodiments in FIG. 2, the selector 114 is implemented with a multiplexer. A first input terminal of the multiplexer is configured to receive the control word CW1, a second input terminal of the multiplexer is electrically coupled to the memory 112 to receive the control word CW2, a control terminal of the multiplexer is configured to receive the state signal PRE_LK2 which indicates that the circuit 100 is operated in the open-loop control mode or the closed loop control mode, and an output terminal of the multiplexer is configured to output the oscillator tuning word OTW.

The control unit 116 is configured to generate the state signal PRE_LK2 in response to the start signal START and the lock signal LD. In some embodiments, the control unit 116 includes an AND gate 1162. The AND gate 1162 includes a first input terminal configured to receive the lock signal LD, a second input terminal configured to receive the start signal START, and an output terminal configured to output the state signal PRE_LK1. In some embodiments, the control unit 116 further includes a delay element 1164. The delay element 1164 is electrically coupled to the AND gate 1162, and configured to delay the state signal PRE_LK1 by a predetermined duration, to generate a state signal PRE_LK2. For example, in some embodiments, the delay element 1164 delays the state signal PRE_LK1 for one clock cycle and sends the delayed state signal PRE_LK2 to the selector 114.

For simplicity of illustration, hereinafter, the signals in the circuit 100 are referred to as logic zero when the signals have low values, and the signals in the circuit 100 are referred to as logic one when the signals have high values.

When the frequency and the phase of the oscillator signal CKV is not locked, the lock signal LD is logic zero. Accordingly, the state signal PRE_LK2 outputted is logic zero. Under this condition, it is indicated that the circuit 100 operates in the closed-loop control mode. As a result, the selector 114 is controlled to output the control word CW1 as the oscillator tuning word OTW.

In some embodiments, when the frequency and the phase of the oscillator signal CKV are locked, the lock signal LD is transited from logic zero to logic one. Before an amplitude calibration of the oscillator signal CKV is complete, the start signal START remains at the logic zero. Accordingly, the AND gate 1162 outputs the state signal PRE_LK1 being logic zero. As a result, the circuit 100 remains in the closed loop control mode. Thus, the selector 114 outputs the control word CW1 as the oscillator tuning word OTW.

When the AND gate 1162 receives the lock signal LD being logic one and the start signal START being logic one, the AND gate 1162 generates the state signal PRE_LK1 being logic one. Accordingly, the selector 114 is controlled to output the control word CW2 as the oscillator tuning word OTW.

In some embodiments, when the frequency control word FCW or the frequency reference signal FREF are changed and the phase lock is lost, the lock signal LD is transited from logic one to logic zero and thus the state signal PRE_LK1 is logic zero, which controls the selector 114 to output the control word CW1 as the oscillator tuning word OTW again.

Thus, in some embodiments, the detector 110 receives the state signal PRE_LK2, and output, in response to the state signal PRE_LK2, one of the control word CW1 and the control word CW2.

The arrangements of the selector 114 and the control unit 116 in FIG. 2 are given for illustrative purposes. Various arrangements of the selector 114 and the control unit 116 are within the contemplated scope of the present disclosure. Furthermore, various proper components are chosen to implement the functional units in the aforementioned embodiments.

Figure 3:
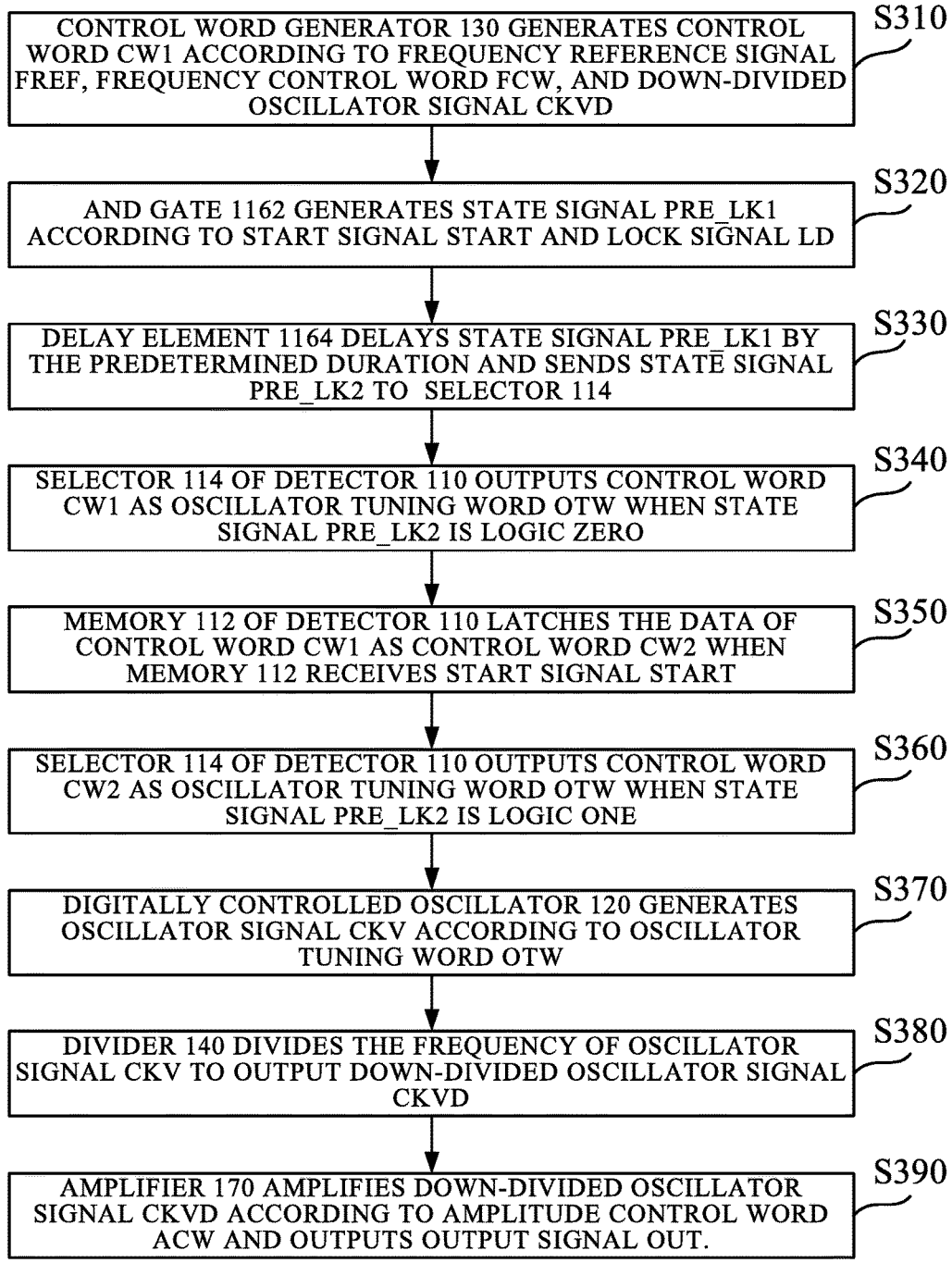
FIG. 3 is a flow chart of a method illustrating operations of the circuit in FIG. 1 in accordance with various embodiments of the present disclosure.
Figure 4:
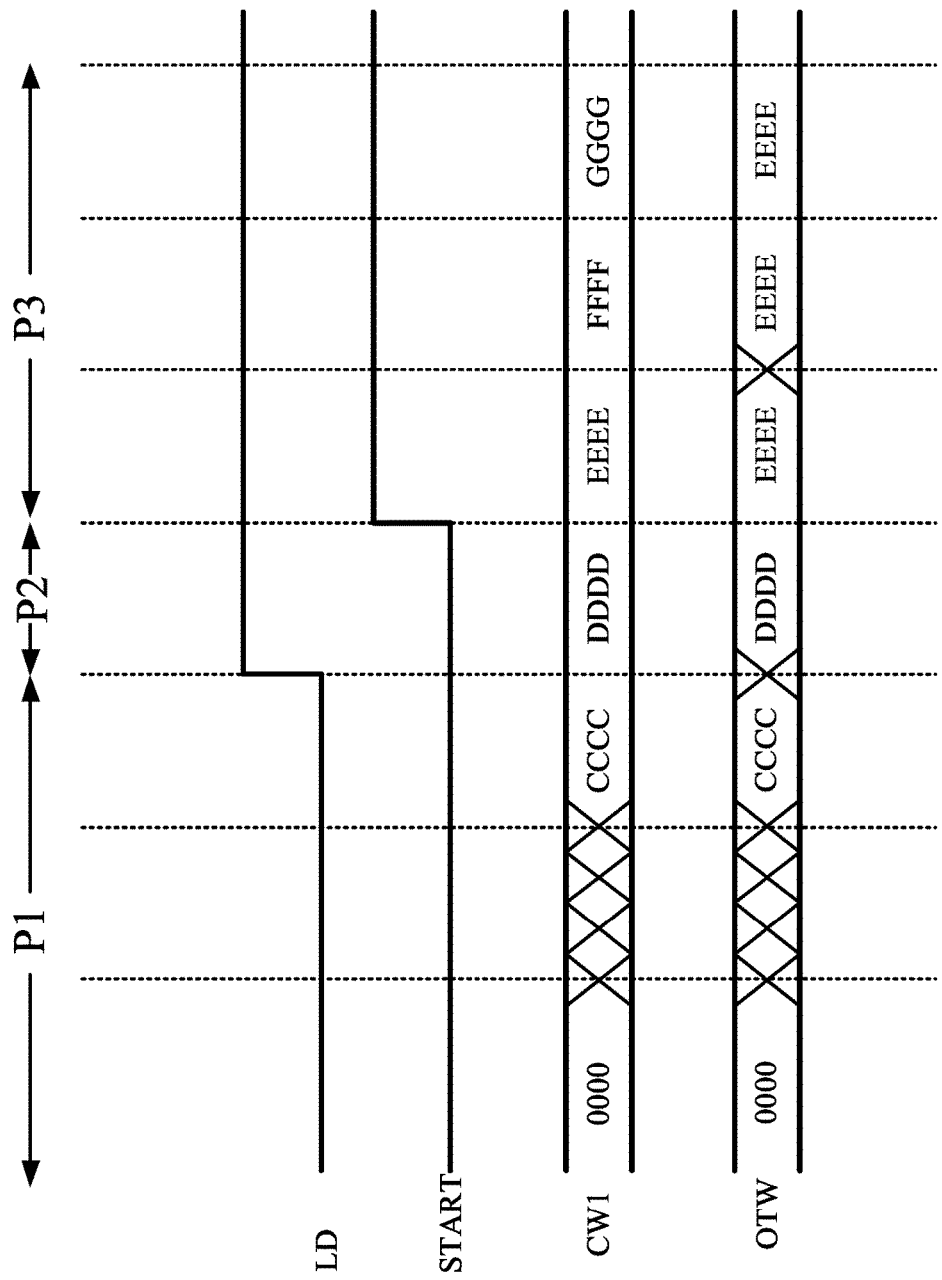
FIG. 4 is a timing diagram for the circuit of FIG. 1 in accordance with various embodiments of the present disclosure.

Reference is made to FIG. 3 and FIG. 4. FIG. 3 is a flow chart of a method 300 illustrating operations of the circuit 100 in FIG. 1, in accordance with various embodiments of the present disclosure. FIG. 4 is a timing diagram for the circuit 100 of FIG. 1 in accordance with various embodiments of the present disclosure. The operations of the circuit 100 in FIG. 1 are described below by the method 300 in FIG. 3 with reference to FIGS. 1-4.

As illustratively shown in FIG. 3, the method 300 includes operations S310, S320, S330, S340, S350, S360, S370, S380, and S390. In operation S310, the control word generator 130 generates the control word CW1 according to the frequency reference signal FREF, the frequency control word FCW, and the down-divided oscillator signal CKVD.

In operation S320, the AND gate 1162 generates the state signal PRE_LK1, according to the start signal START and the lock signal LD. For example, the AND gate 1162 performs AND operation of the start signal START and the lock signal LD, and generates the state signal PRE_LK1 accordingly.

In operation S330, the delay element 1164 delays the state signal PRE_LK1 by the predetermined duration and sends the state signal PRE_LK2 to the selector 114. In some embodiments, the delay element 1164 delays the state signal PRE_LK1 by at least one clock period, and outputs the state signal PRE_LK2 lagging behind the state signal PRE_LK1 by at least one clock period.

In operation S340, the selector 114 outputs the control word CW1 as the oscillator tuning word OTW when the state signal PRE_LK2 is logic zero.

As illustratively shown in FIG. 4, during the time period P1, the frequency and the phase of the oscillator signal CKV is not locked and the lock signal LD and the start signal START are logic zero, and thus the state signal PRE_LK2 is logic zero. Under this condition, the detector 110 outputs the control word CW1 as the oscillator tuning word OTW. For illustration in FIG. 4, as the control word CW1 transits from 0000 to CCCC, the oscillator tuning word OTW transits from 0000 to CCCC.

During the time period P2, the frequency and the phase of the oscillator signal CKV are locked, and the lock signal LD transits from logic zero to logic one. The start signal START remains logic zero indicating the circuit 100 still operates in the closed-loop control mode. Since the start signal START remains logic zero, the state signal PRE_LK2 is logic zero, and the detector 110 outputs the control word CW1 as the oscillator tuning word OTW. For illustration, as the control word CW1 change to DDDD, the oscillator tuning word OTW change to DDDD as shown in FIG. 4.

During the time period P3, the lock signal LD remains logic one, and the start signal START shifts from logic zero to logic one, indicating that the circuit 100 operates in the open-loop control mode. Thus, operation S350 is performed in the circuit 100.

In operation S350, the memory 112 latches the data of the control word CW1 as the control word CW2 when the memory 112 receives the start signal START. In operation S360, the selector 114 outputs the control word CW2 as the oscillator tuning word OTW when the state signal PRE_LK2 is logic one.

As illustratively shown in FIG. 4, since the control word CW1 is EEEE when the start signal START is received, the detector 110 stores EEEE as the control word CW2. Since the lock signal LD and the start signal START are both logic one, the state signal PRE_LK2 is logic one, and the detector 110 outputs the control word CW2 as the oscillator tuning word OTW. Thus, during the time period P3, the oscillator tuning word OTW is configured to EEEE, no matter what value the control word CW1 is.

In operation S370, the digitally controlled oscillator 120 generates the oscillator signal CKV according to the oscillator tuning word OTW.

In some embodiments, the method 300 further includes operation S380 and S390. In operation S380, the divider 140 divides the frequency of the oscillator signal CKV to output the down-divided oscillator signal CKVD. In operation S390, the amplifier 170 amplifies the down-divided oscillator signal CKVD according to the amplitude control word ACW and outputs the output signal OUT.

The above description includes exemplary operations, but the operations are not necessarily performed in the order described. The order of the operations disclosed in the present disclosure are able to be changed, or the operations are able to be executed simultaneously or partially simultaneously as appropriate, in accordance with the spirit and scope of various embodiments of the present disclosure.

Figure 5:
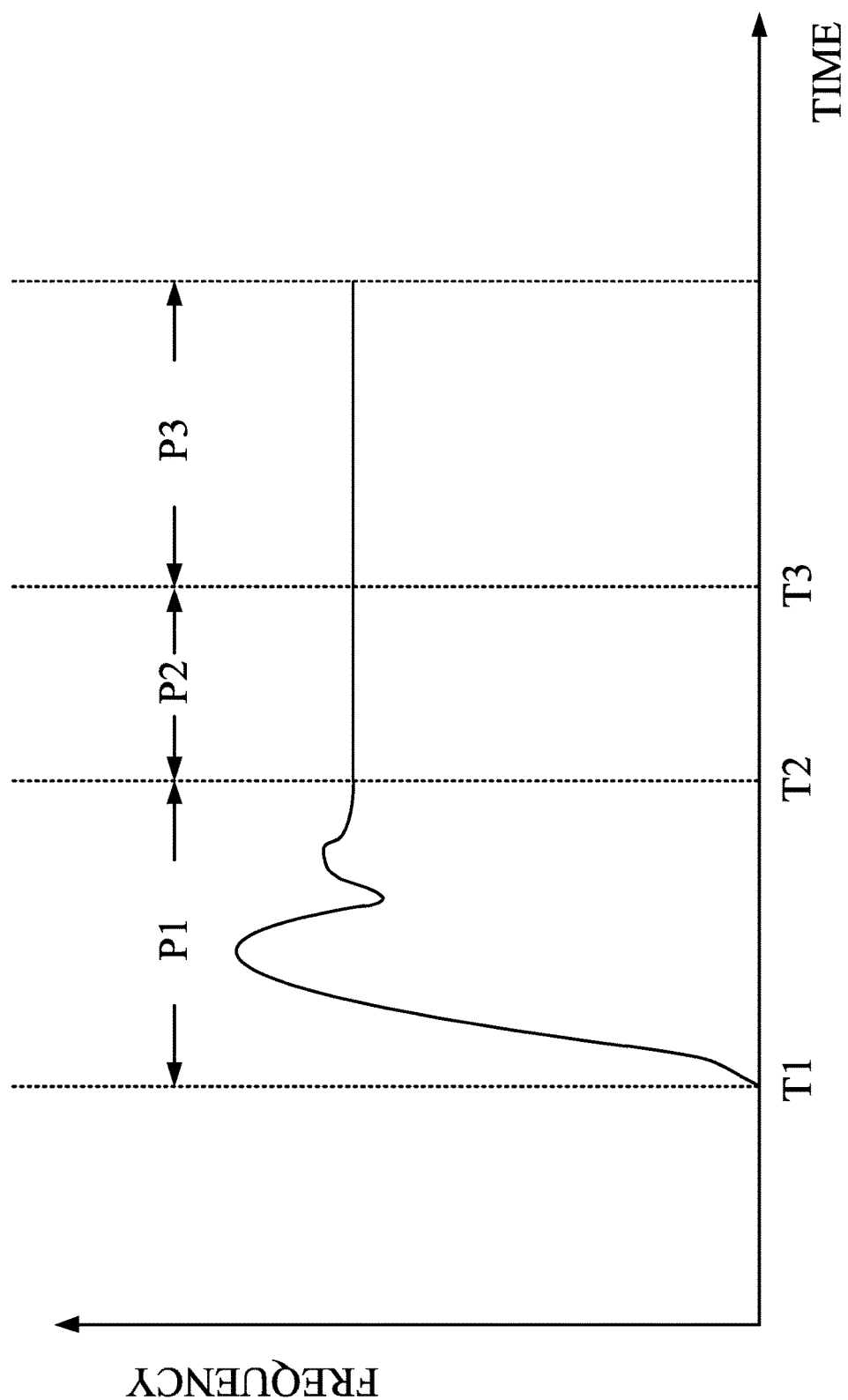
FIG. 5 is a time-frequency diagram for the oscillator signal of the circuit illustrated in FIG. 1 and the timing diagram illustrated in FIG. 4 in accordance with various embodiments of the present disclosure.

Reference is made to FIG. 5. FIG. 5 is a time-frequency diagram for the oscillator signal CKV of the circuit 100 illustrated in FIG. 1 and the timing diagram illustrated in FIG. 4 in accordance with various embodiments of the present disclosure. At time T1, the circuit 100 starts and operates in the closed-loop control mode. During the time period P1, the frequency and the phase of the oscillator signal CKV is not locked.

At time T2, the oscillator signal CKV is locked. During the time period P2, the frequency and the phase of the oscillator signal CKV is locked and the amplitude calibration of the oscillator signal CKV is performed, and the circuit 100 still operates in the closed-loop control mode.

At time T3, the detector 110 receives the start signal START and the circuit 100 starts to operate in the open-loop control mode. During the time period P3, the oscillator tuning word OTW is kept at the control word CW2 stored in the detector 110. In some embodiments, when the oscillator tuning word OTW is kept at the control word CW2, the digital circuits of the control word generator 130 are turned off during the time period P3. Accordingly, the digital power consumption in the open-loop control mode is reduced. When the circuit 100 operates in the closed-loop control mode again, the digital circuits of the control word generator 130 are turned on again to perform the closed-loop control in order to lock the phase and the frequency of the oscillator signal CKV.

Figure 6:
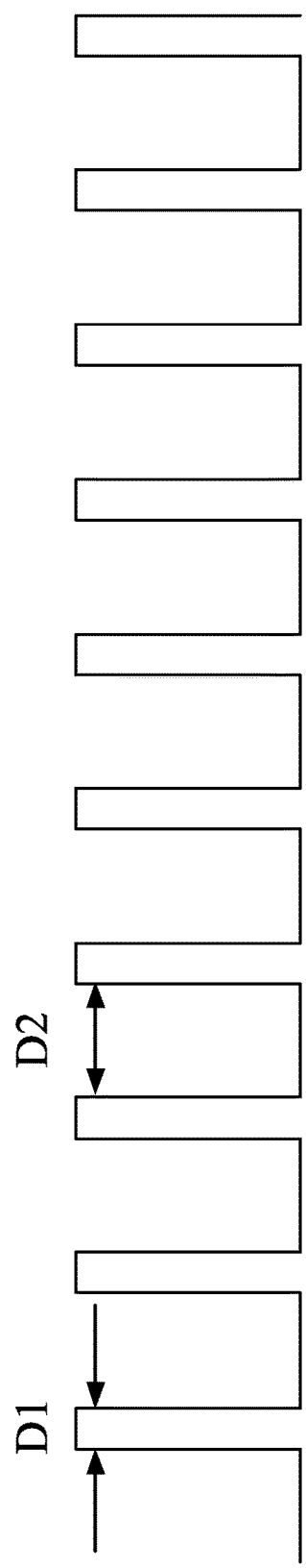
FIG. 6 is a schematic diagram illustrating the period of the circuit illustrated in FIG. 1 operating in the closed-loop control mode in accordance with various embodiments of the present disclosure.

Reference is made to FIG. 6. FIG. 6 is a schematic diagram illustrating the period of the circuit 100 illustrated in FIG. 1 operating in the closed-loop control mode in accordance with various embodiments of the present disclosure. At duration D1, the frequency and the phase of the oscillator signal CKV is not locked, and the circuit 100 operates in the closed-loop control mode. On the other hand, at duration D2, the circuit 100 operates in the open-loop control mode. As illustratively shown in FIG. 6, in some embodiments, the locking time of the duration D1 is 20 microseconds in 625 microseconds. Alternatively stated, the on time of the digital circuits of the control word generator 130 is 3.2% in the complete cycle. On the other hand, the off time of the digital circuits is 96.8% of the complete cycle, and thus the circuit 100 achieves 96.8% power saving.

As described above, in the embodiments disclosed in the present disclosure, the circuit 100 is configured to operate in the closed-loop control mode or the open-loop control mode according to the lock signal LD and the start signal START. When the circuit 100 operates in the closed-loop control mode, the detector 110 output the control word CW1 as the oscillator tuning word OTW in order to control the oscillator signal CKV outputted by the digitally controlled oscillator 120 to lock the phase and the frequency of the oscillator signal CKV with the feedback control loop of the control word generator 130. When the circuit 100 operates in the open-loop control mode, the detector 110 stores the control word CW2 which is derived from the control word CW1, and outputs the control word CW2 as the oscillator tuning word OTW in order to control the oscillator signal CKV outputted by the digitally controlled oscillator 120. In some embodiments, the digital circuits of the control word generator 130 are configured to be OFF to reduce the power consumption during the open-loop control mode.

In some embodiments, a circuit is disclosed that includes a digitally controlled oscillator and a detector. The digitally controlled oscillator is configured to generate an oscillator signal according to an oscillator tuning word. The detector is configured to output one of a first control word and a second control word that is derived from the first control word as the oscillator tuning word.

Also disclosed is a circuit that includes a digitally controlled oscillator and a detector. The digitally controlled oscillator is configured to generate an oscillator signal according to an oscillator tuning word. The detector is configured to detect a mode of the circuit. In a first mode, the detector is further configured to output a first control word as the oscillator tuning word, and in a second mode, the detector is further configured to output a second control word as the oscillator tuning word.

Also disclosed is a method that includes the following operations: generating an oscillator signal, by a digitally controlled oscillator, according to an oscillator tuning word; generating a second control word, by a detector, in response to a first control word; and outputting one of the first control word and the second control word as the oscillator tuning word, by the detector, according to a state signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a digitally controlled oscillator configured to generate an oscillator signal according to an oscillator tuning word; and
   a detector configured to output one of a first control word and a second control word that is derived from the first control word, as the oscillator tuning word,
   wherein the detector is further configured to latch the first control word and to output the latched first control word as the second control word in response to a start signal, and the output of the latched first control word is provided to the digitally controlled oscillator.

2. The circuit of claim 1, wherein the detector comprises:
   a selector configured to select one of the first control word and the second control word, as the oscillator tuning word, according to a state signal.

3. The circuit of claim 2, wherein the detector further comprises:
   a control unit configured to generate the state signal, in response to the start signal and a lock signal.

4. The circuit of claim 1, wherein the detector comprises:
   a memory configured to latch the first control word as the second control word according to the start signal.

5. The circuit of claim 4, wherein the detector further comprises:
   a multiplexer configured to receive the first control word and the second control word that is outputted from the memory, and configured to select, in response to a state signal, one of the first control word and the second control word, as the oscillator tuning word.

6. The circuit of claim 5, wherein the detector further comprises:
   an AND gate configured to receive a lock signal and the start signal, and output the state signal.

7. A circuit comprising:
   a digitally controlled oscillator configured to generate an oscillator signal according to an oscillator tuning word; and
   a detector configured to detect a mode of the circuit;
   wherein in a first mode, the detector is further configured to output a first control word as the oscillator tuning word, and in a second mode, the detector is further configured to output a second control word as the oscillator tuning word,
   wherein in response to a start signal, the first control word is latched, and the latched first control word is output as the second control word and provided to the digitally controlled oscillator.

8. The circuit of claim 7, wherein the detector is configured to output, in response to a state signal, one of the first control word and the second control word.

9. The circuit of claim 7, wherein the detector is configured to keep the data of the second control word when the detector receives the start signal.

10. The circuit of claim 7, wherein the detector comprises:
    a selector configured to select one of the first control word and the second control word, as the oscillator tuning word, according to a state signal.

11. The circuit of claim 10, wherein the detector further comprises:
    a control unit configured to generate the state signal according to the start signal and a lock signal.

12. The circuit of claim 7, wherein the detector comprises:
    a memory configured to latch the first control word as the second control word when the memory receives the start signal.

13. The circuit of claim 12, wherein the detector further comprises:
- a multiplexer configured to receive the first control word and the second control word that is outputted from the memory, and configured to select one of the first control word and the second control word, as the oscillator tuning word in response to a state signal.

14. The circuit of claim 13, wherein the detector further comprises:
- an AND gate configured to receive a lock signal and the start signal, and output the state signal.

15. A method comprising:
- generating an oscillator signal, by a digitally controlled oscillator, according to an oscillator tuning word;
- in response to a start signal, latching a first control word and generating the latched first control word as a second control word, by a detector; and
- outputting, to the digitally controlled oscillator, one of the first control word and the second control word as the oscillator tuning word, by the detector, according to a state signal.

16. The method of claim 15, wherein latching the first control word comprises:
- latching the first control word, by a memory of the detector, as the second control word when the memory receives the start signal.

17. The method of claim 15, further comprising:
- generating the state signal, by a control unit of the detector, according to the start signal and a lock signal.

18. The method of claim 15, wherein outputting one of the first control word and the second control word as the oscillator tuning word comprises:
- outputting the first control word as the oscillator tuning word, by a selector of the detector, when the state signal has a first value.

19. The method of claim 18, wherein outputting one of the first control word and the second control word as the oscillator tuning word further comprises:
- outputting the second control word as the oscillator tuning word, by the selector of the detector, when the state signal has a second value.

20. The circuit of claim 6, wherein the detector further comprises:
- a delay element configured to delay the state signal that is outputted by the AND gate, the delay element configured to output the delayed state signal to the multiplexer.

* * * * *